(12) United States Patent
Andrews et al.

(10) Patent No.: US 8,654,894 B2
(45) Date of Patent: Feb. 18, 2014

(54) PROCESSING TRANSMISSIONS IN A WIRELESS COMMUNICATION SYSTEM

(75) Inventors: Edward Andrews, St. Andrews (GB); Carlo Luschi, Oxford (GB); Jonathan Wallington, North Somerset (GB)

(73) Assignee: ICERA, Inc., Wilmington, DE (US)

( * ) Notice: Subject to any disclaimer, the term of this patent is extended or adjusted under 35 U.S.C. 154(b) by 716 days.

(21) Appl. No.: 12/667,142

(22) PCT Filed: Jun. 20, 2008

(86) PCT No.: PCT/EP2008/057889
§ 371 (c)(1),
(2), (4) Date: Jun. 1, 2010

(87) PCT Pub. No.: WO2009/003859
PCT Pub. Date: Jan. 8, 2009

(65) Prior Publication Data
US 2010/0254445 A1     Oct. 7, 2010

(30) Foreign Application Priority Data

Jun. 29, 2007     (GB) .................................. 0712701.2

(51) Int. Cl.
*H04B 17/00*     (2006.01)
(52) U.S. Cl.
USPC ........... 375/316; 375/341; 375/224; 375/227; 370/252; 370/328; 370/329; 370/342; 370/335; 455/522
(58) Field of Classification Search
USPC .......... 375/260, 267, 316, 348, 341; 370/201, 370/252, 328, 329, 342, 335; 714/755
See application file for complete search history.

(56) References Cited

U.S. PATENT DOCUMENTS

| | | | |
|---|---|---|---|
| 7,180,932 B1 | 2/2007 | Heinila et al. | |
| 7,231,183 B2 * | 6/2007 | Pauli et al. | ................. 455/67.11 |
| 7,519,897 B2 | 4/2009 | Hashimoto | |
| 2005/0041626 A1 * | 2/2005 | Tiirola et al. | ................. 370/335 |
| 2007/0260959 A1 * | 11/2007 | Sidi et al. | ...................... 714/755 |

FOREIGN PATENT DOCUMENTS

| | | |
|---|---|---|
| CN | 1809982 A | 7/2006 |
| JP | 2006101077 A | 4/2006 |
| JP | 2008160260 A | 7/2008 |
| WO | 2009003859 A2 | 1/2009 |

OTHER PUBLICATIONS

PCT/EP2008/057889; International Search Report.
(Continued)

*Primary Examiner* — Shuwang Liu
*Assistant Examiner* — Ross Varndell

(57) ABSTRACT

Disclosed herein are methods of processing transmissions in a wireless communication system to detect whether a transmission unit contains transmitted data, systems for processing transmissions in a digital communications system to detect the same, receivers for processing transmissions in a wireless communications system and computer readable media implementing a method for processing the same. In one embodiment, a method of processing transmissions in a wireless communication system to detect whether a transmission unit contains transmitted data includes: generating an averaged function of bit reliability indicators from a plurality of received samples and applying a test to compare an average of ln cosh(·) (natural logarithm of the hyperbolic cosine) values for the reliability indicators, with a factor proportional to an average signal-to-disturbance ratio of the plurality of samples to determine if the transmission unit contains transmitted data.

27 Claims, 7 Drawing Sheets

(56) References Cited

OTHER PUBLICATIONS

Ramprashad S. A. et al.: "Locally Most Powerful Invariant Tests for Signal Detection" IEEE Transactions on Information Theory, vol. 44, No. 3, May 1998; pp. 1283-1288.
"Universal Mobile Telecommunications System (UMTS); Multiplexing and channel coding (FDD)"; Jun. 2005.

"3rd Generation Partnership Project; Technical Specification Group Radio Access Network; Multiplexing and Channel Coding (FDD) (Release 7)," 3GPP TS 25.212, V7.5.0, May 2007, 8 pages.
Nelson, J. K., et al. "Bayesian ML Sequence Detection for ISI Channels," IEEE, Information Sciences and Systems, Mar. 2006, 9 pages.
Japanese Office Action dated Oct. 9, 2012, Application No. 2010-513868, 2 pages.

* cited by examiner

PROCESSING TRANSMISSIONS IN A WIRELESS COMMUNICATION SYSTEM

CROSS-REFERENCE TO RELATED APPLICATION

This application is the National Stage of, and therefore claims the benefit of, International Application No. PCT/EP2008/057889 filed on Jun. 20, 2008, entitled "PROCESSING TRANSMISSIONS IN A WIRELESS COMMUNICATION SYSTEM," which was published in English under International Publication Number WO 2009/003859 on Jan. 8, 2009, and has a priority date of Jun. 29, 2007, based on the application GB 0712701.2. Both of the above applications are commonly assigned with this National Stage application and are incorporated herein by reference in their entirety.

TECHNICAL FIELD

This application is directed, in general, to processing transmissions in a wireless communication system, particularly where a receiver does not have information about the transmission format.

BACKGROUND

In the 3rd Generation Partnership Project (3GPP) Wideband Code Division Multiple Access (WCDMA) forward link, multiple Dedicated Channels (DCHs) can be separately encoded and punctured, and then multiplexed for transmission over the same Dedicated Physical Channel (DPCH) (3GPP TS 25.212, "Technical Specification Group Radio Access Network; Multiplexing and Channel Coding (FDD)", June 2005, Section 4). For each DCH transport channel, a variable number of information data blocks, may be encoded and simultaneously transmitted on the DPCH. The particular format of each transmission is normally signaled to a mobile terminal or User Equipment (UE) by a Transport Format Combination Indicator (TFCI), which specifies for each DCH transport channel the transport block size (i.e., number of bits contained in each transport block) and the number of transmitted transport blocks (plus additional parameters related to puncturing and channel encoding) (3GPP TS 25.302, "Technical Specification Group Radio Access Network; Services Provided by the Physical Layer", September 2005).

However, the WCDMA standard requires that, under certain conditions, the UE be able to infer the transport format used for a transmission, without explicit signaling of the transport format combination indicator TFCI. In this case, the user equipment UE should rely on specific receiver signal processing functions for blind transport format detection. When, for each transport channel, the set of possible transport formats contains only one transport format with more than zero transport blocks, the user equipment should perform a specific processing function referred to as single transport format detection (3GPP TS 25.212, "Technical Specification Group Radio Access Network; Multiplexing and Channel Coding (FDD)", June 2005, Section 4.3.1a), where the user equipment only needs to distinguish between the cases where the DCH transmission contains zero or one transport block (data rates equal to zero or full-rate).

In a WCDMA system, transmissions are made in Transmission Time Intervals (TTIs) of the duration of one or more 10 ms radio frames. Each 10 ms radio frame is further subdivided in 15 time slots, each containing 2560 chips. DCH data transmitted on a DPCH over one TTI can contain one transport block or multiple blocks.

A method for blind single transport format detection is suggested in 3GPP TS 25.212, "Technical Specification Group Radio Access Network; Multiplexing and Channel Coding (FDD)", June 2005, Annex A (Informative): Blind Transport Format Detection, Section A.1.1. This method is based on an estimate of the power per bit of the dedicated physical data channel DPDCH, $P_{DPDCH}$ which is compared against an estimate of the power per bit of the dedicated physical control channel DPCCH, $P_{DPCCH}$. Both power estimates are calculated per slot and averaged over one 10 ms frame. If the ratio $P_{DPDCH}/P_{DPCCH}$ exceeds some threshold T, then it is declared that the full rate transport format has been detected, else it is declared that the zero rate transport format has been detected.

In the case where code blocks of different DCH transport channels are multiplexed and transmitted on the same DPCH channel, the above approach requires the identification of the DPCH slot data that correspond to the different transport channel.

SUMMARY

According to one aspect of the present invention, there is provided a method of processing transmissions in a wireless communication system to detect whether a transmission unit contains transmitted data. In one embodiment, the method includes: (1) receiving a plurality of samples of a transmission unit; (2) determining an average signal-to-disturbance ratio of the plurality of samples, (3) determining for each sample at least one bit reliability indicator, which is related to the probability that the transmitted bit is a one or a zero, (4) generating an averaged function of the bit reliability indicators from the plurality of received samples, and (5) applying a test to compare an average of ln cos h(·) (natural logarithm of the hyperbolic cosine) values for the reliability indicators, with a factor proportional to the average signal-to-disturbance ratio to determine if the transmission unit contains transmitted data.

The present invention also provides another method of processing transmissions in a wireless communication system to detect whether a transmission unit contains transmitted data. In an embodiment of this aspect of the invention, the method includes: (1) receiving a plurality of samples of a transmission unit, (2) determining an average signal-to-disturbance ratio of the plurality of samples, (3) determining for each sample at least one bit reliability indicator which represents the probability that the transmitted bit is a one or a zero, (4) generating an averaged function of the bit reliability indicators from the plurality of received samples and (5) applying a test to compare an average of the absolute values of the reliability indicators with a value which is the sum of a factor proportional to the average signal-to-disturbance ratio and a selectable constant According to another aspect of the present invention, there is provided a system for processing transmissions in a digital communications system to detect whether a transmission unit contains transmitted data. In one embodiment, the system includes: (1) means for receiving a plurality of samples of a transmission unit, (2) means for determining an average signal-to-disturbance ratio over the plurality of samples, (3) means for determining for each sample at least one bit reliability indicator, which is related to the probability that the transmitted bit is a one or a zero, (4) means for generating an average function of the bit reliability indicators from the plurality of received samples and (5) means for applying a test to compare an average of ln cos h(·) (natural logarithm of the hyperbolic cosine) values for the reliability indicators with a factor proportional to the average signal-to-disturbance ratio to determine if a transmission unit contains transmitted data.

In yet another embodiment, a system is provided that includes: (1) means for receiving a plurality of samples of a transmission unit, (2) means for determining an average signal-to-disturbance ratio over the plurality of samples, (3) means for determining for each sample at least one bit reliability indicator which is related to the probability that the transmitted bit is a one or a zero, (4) means for generating an average function of the bit reliability indicators from the plurality of received samples and (5) means for applying a test to compare an average of the absolute values of the reliability indicators with a value which is a sum of a factor proportional to the average signal to disturbance ratio and a selectable constant.

In still another aspect, a receiver is disclosed for processing transmissions in a wireless communications system. In one embodiment, the receiver includes: (1) means for receiving a plurality of samples of a transmission unit, (2) means for determining an average signal-to-disturbance ratio of the plurality of samples, (3) means for determining for each sample at least one bit reliability indicator which is related to the probability that the transmitted bit is a one or a zero, (4) means for generating an average function of the bit reliability indicators from the plurality of received samples and (5) means for applying a test to compare an average of ln cos h(·) (natural logarithm of the hyperbolic cosine) values for the reliability indicators with a factor proportional to the average signal-to-disturbance ratio to determine if the transmission unit contains transmitted data.

In yet another embodiment, the receiver includes: (1) means for receiving a plurality of samples of a transmission unit, (2) means for determining an average signal-to-disturbance ratio of the plurality of samples, (3) means for determining for each sample at least one bit reliability indicator which is related to the probability that the transmitted bit is a one or a zero, (4) means for generating an average function of the bit reliability indicators from the plurality of received samples and (5) means for applying a test to compare an average of the absolute values of the reliability indicators with a value which is the sum of a factor proportional to the average signal-to-disturbance ratio and a selectable constant to determine if the transmission unit contains transmitted data.

In still a different aspect, the present invention provides a computer readable media including a computer program having a sequence of instructions which when executed by a computer implement a method of processing transmissions in a wireless communications system. In one embodiment, the method implemented by the computer program comprises the steps of: (1) receiving a plurality of samples of a transmission unit, (2) determining an average signal-to-disturbance ratio of the plurality of samples, (3) determining for each sample at least one bit reliability indicator which is related to the probability that the transmitted bit is a one or a zero, (4) generating an averaged function of the bit reliability indicators from the plurality of received samples and (5) applying a test to compare an average of ln cos h(·) (natural logarithm of the hyperbolic cosine) values for the reliability indicators, with a factor proportional to the average signal-to-disturbance ratio to determine if the transmission unit contains transmitted data.

In another embodiment of a computer readable media, a method implemented by a computer program includes the steps of: (1) receiving a plurality of samples of a transmission unit; (2) determining an average signal-to-disturbance ratio of the plurality of samples, (3) determining for each sample at least one bit reliability indicator which is related to the probability that the transmitted bit is a one or a zero, (4) generating an averaged function of the bit reliability indicators from the plurality of received samples, (5) applying a test to compare an average of ln cos h(·) (natural logarithm of the hyperbolic cosine) values for the reliability indicators, with a factor proportional to the average signal-to-disturbance ratio to determine if the transmission unit contains transmitted data and (6) applying a test to compare an average of the absolute values of the reliability indicators with a value which is the sum of a factor proportional to the average signal-to-disturbance ratio and a selectable constant.

BRIEF DESCRIPTION

Reference is now made by way of example to the following descriptions taken in conjunction with the accompanying drawings, in which.

DETAILED DESCRIPTION

Figure 1:
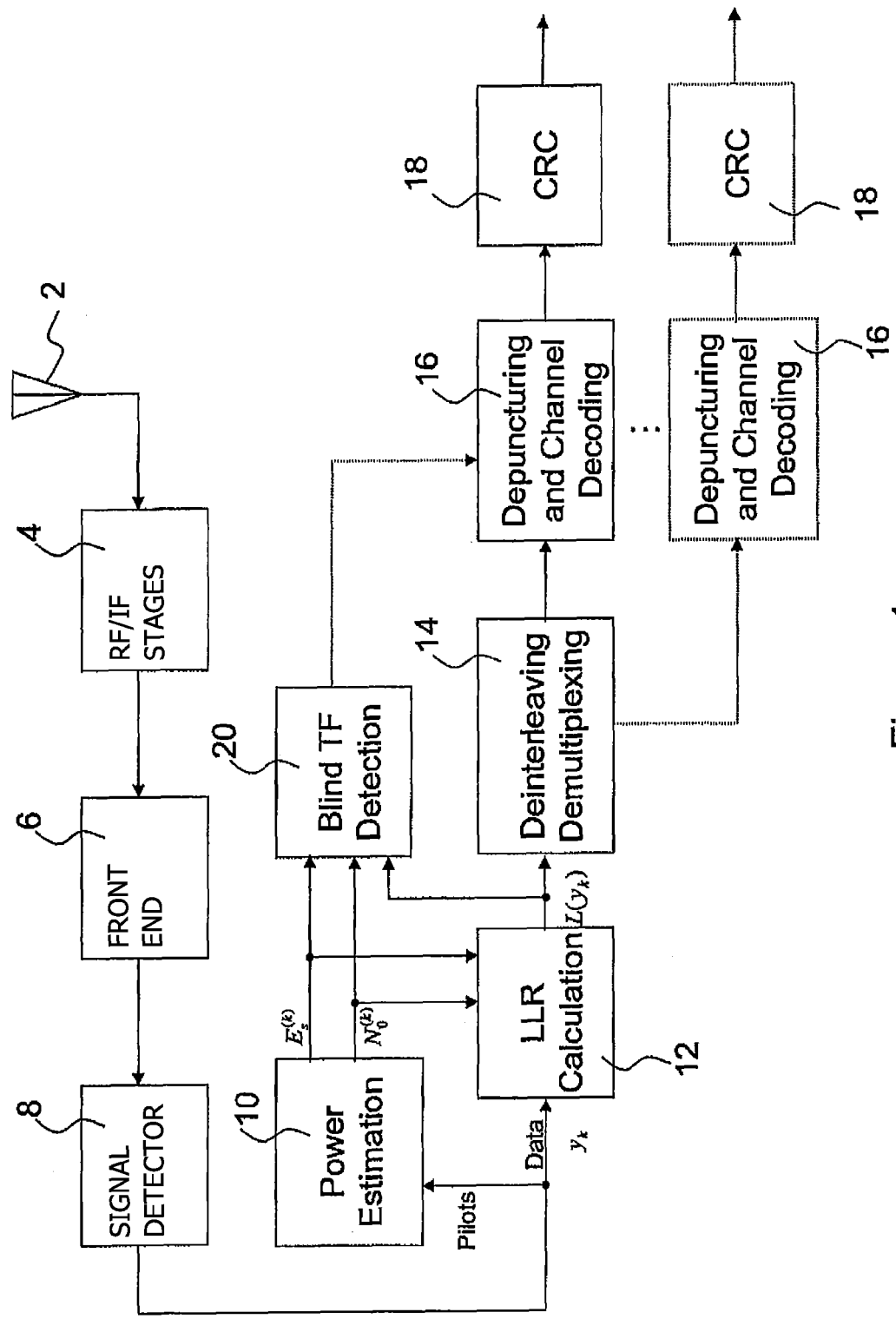
FIG. 1 is a schematic block diagram of an embodiment of a system in accordance with one embodiment of the invention.

The disclosure provides embodiments of a method, a system, a receiver and a computer readable media that process wireless transmissions. One aspect of the invention provides a method of processing transmissions in a wireless communication system to detect whether a transmission unit contains transmitted data, the method comprising: receiving a plurality of samples of a transmission unit; determining an average signal-to-disturbance ratio of the plurality of samples; determining for each sample one or more bit reliability indicators, which is related to the probability that the transmitted bit is a one or a zero; generating an averaged function of the reliability indicators from the plurality of received samples; and applying a test using the averaged function of the reliability indicators and the average signal-to-disturbance ratio to determine if the transmission unit contains transmitted data.

Another aspect of the invention provides a system for processing transmissions in a digital communications system to detect whether a transmission unit contains transmitted data, the system comprising: means for receiving a plurality of samples of a transmission unit; means for determining an average signal-to-disturbance ratio over the plurality of samples; means for determining for each sample one or more bit reliability indicators, which is related to the probability that the transmitted bit is a one or a zero; means for generating an average function of the bit reliability from the plurality of received samples; means for applying a test using the average function of the reliability indicators and the average signal-to-disturbance ratio to determine if the transmission unit contains transmitted data.

In one embodiment, the test which is applied is formulated based on a Bayes test. Unlike the prior art blind single transport format detection techniques discussed above, the method described in the following embodiments does not rely on a comparison of power estimates for different portions of the DPCH time slot. The problem of detecting the presence of a transmitted signal of specified characteristics from observation of a set of received samples is a classical problem of detection theory, which has been widely studied in the context of detection of signal in noise and hypothesis testing (see, e.g., H. L. Van Trees, Detection, Estimation, and modulation Theory, John Wiley & Sons, 1968, A. Papoulis, Probability, Random Variables and Stochastic Processes, McGray-Hill, 1991, and references therein). The proposed method is based on a likelihood ratio test deriving from the same principles as that discussed in the classical detection theory, but differs from the classical solutions, with the specific advantage of allowing signal detection over a wider range of signal-to-noise ratios, above a threshold selected taking into account a specified error performance limit. The method has a general use, but finds particular application in single transport format detection in a 3GPP WCDMA receiver.

A block diagram including the main functionalities of a WCDMA receiver in accordance with an embodiment of the invention is illustrated in FIG. 1. In FIG. 1 reference numeral 2 denotes an antenna which receives a wireless transmission and supplies it in analogue form to RF and IF stages 4, themselves known in the art. A receiver front-end 6 includes the functions of analogue to digital conversion and receives root-raised cosine filtering, and a signal detector 8, which is typically implemented by a rake receiver, that descrambles and despreads the relevant downlink codes. For each time slot, the DPCH is constituted by the Dedicated Physical Data Channel (DPDCH) and the Dedicated Physical Control Channel (CPCCH). The DPDCH fields of the DPCH slot contain data symbols (user data) deriving from the code blocks of the different DCH transport channels, whereas the DPCCH fields contain control information (including pilot symbols), which is always transmitted independently of the presence of user data. The received samples corresponding to the pilot field are supplied to a power estimation block and the received samples corresponding to the data fields are supplied to an LLR calculation block 12. Signal detection is followed by calculation of the bit log-likelihood ratios (LLRs) in block 12, which provide reliability information for soft-input channel decoding. The receiver also comprises a deinterleaving and demultiplexing function 14. After deinterleaving/demultiplexing, each transport channel is provided with a depuncturing and channel decoding function 16 and a CRC (cyclic redundancy check) function 18.

The receiver further includes a blind transport format detection function 20. The detection function 20 receives signal power estimates $E_s$ and disturbance estimates $N_0$ from the power estimation block 10 as well as LLRs $L(y_k)$ from the LLR calculation block 12. In a manner to be described more fully herein, the blind transport format detection function makes a distinction between a zero transport block (data rate equal to zero) and a non-zero transport block (full rate data). In one embodiment, the operations of deinterleaving, depuncturing, channel decoding and CRC check need to be performed only if the detection algorithm has identified the transmission of a non-zero size transport block.

Figure 2:
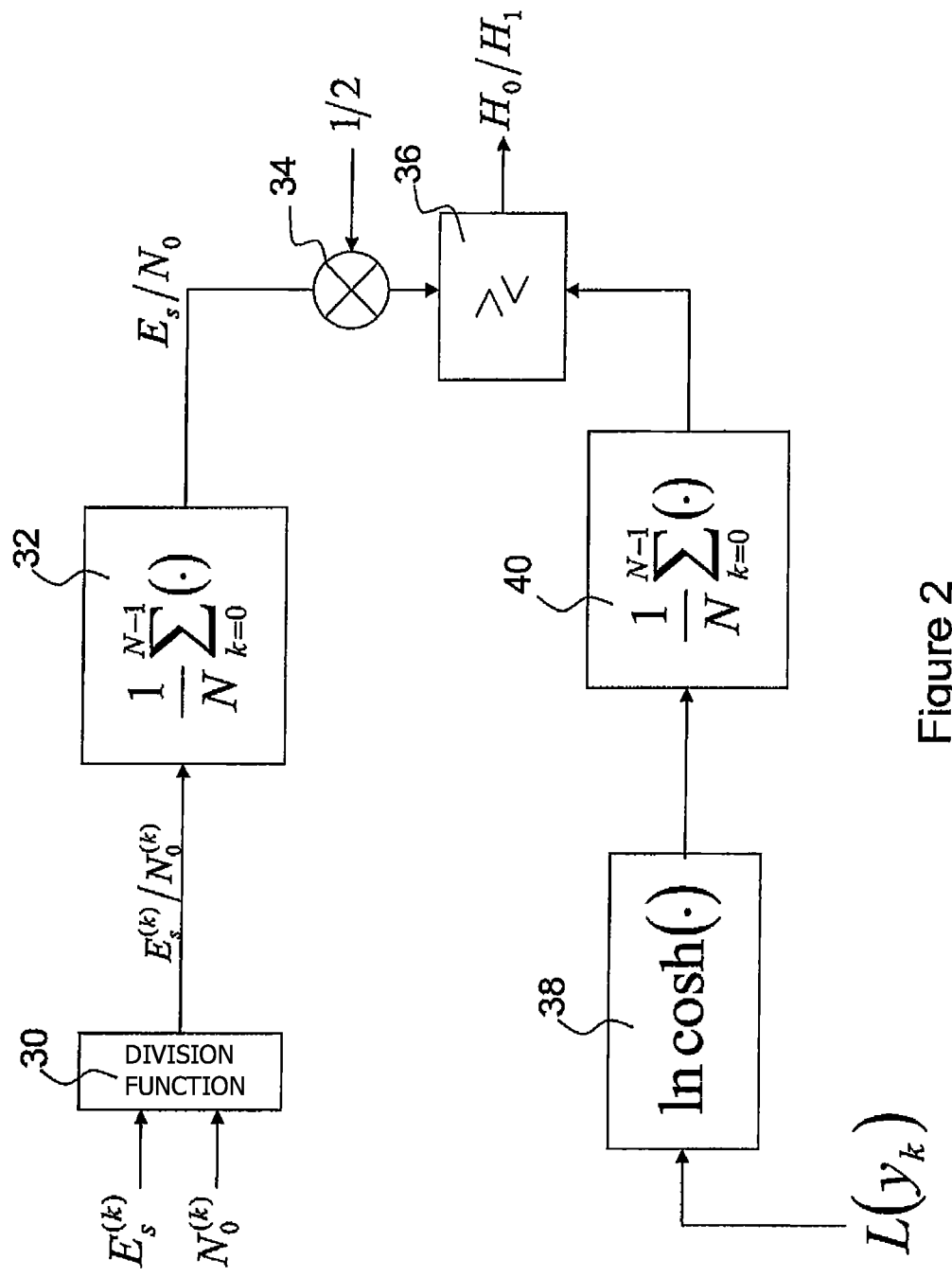
FIG. 2 is a schematic block diagram of an optimum detection technique.
Figure 3:
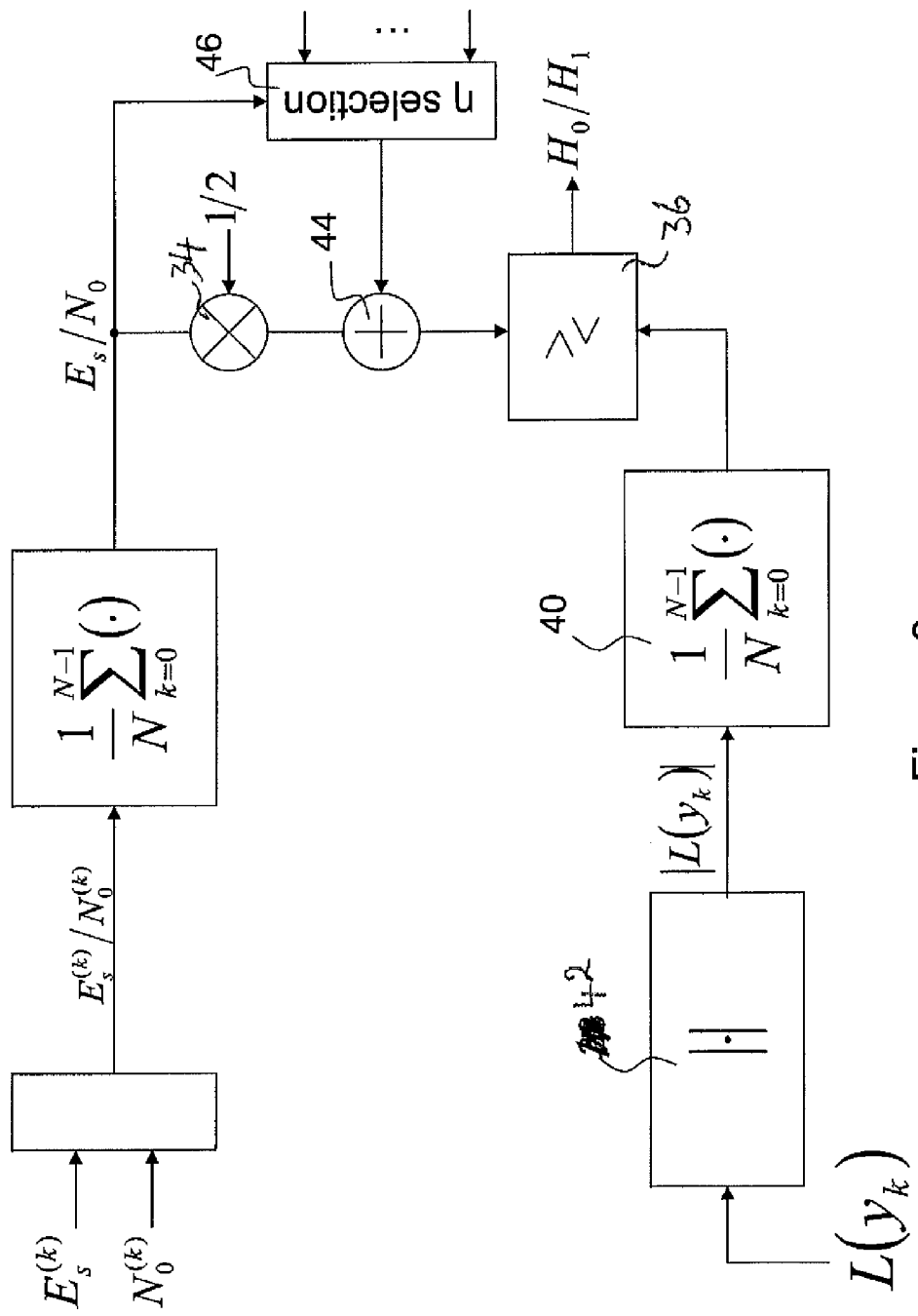
FIG. 3 is a schematic block diagram of an approximate detection technique.

Reference will now be made to FIGS. 2 and 3 to discuss two different detection processes. One is referred to as an optimum detection process (FIG. 2), and the other is referred to as an approximate detection process (FIG. 3). Either or both of these detection processes can be implemented in the blind TF detection block 20. The choice of which detection process is implemented, and if they are both implemented the choice of which process to use in any particular circumstances is discussed more fully in the following. Both processes derive from a detection algorithm which will now be discussed.

The single transport format detection algorithm is based on an approximation of the optimum Bayes test (known as the likelihood ratio test) for detection of a transmitted signal in noise. The following derivation refers to the case of a Quadrature Phase Shift Keying (QPSK) modulated signal, which is relevant for the DPCH channel of 3GPP WCDMA, but it will be appreciated that straightforward modification allows the extension of the algorithm to different signal modulation formats.

Under the hypothesis of transmitted signal, a QPSK data sequence with independent identically distributed (i.i.d) in-phase and quadrature symbols $a_k \in \{+1/\sqrt{2}, -1/\sqrt{2}\}$ is assumed. Denoting by $y_k$ the k-th in-phase or quadrature received signal sample, the aim is to discriminate between the two hypotheses:

$$H_0: y_k = n_k$$

$$H_1: y_k = a_k \sqrt{E_s^{(k)}} + n_k \quad \text{Equation (1)}$$

where $E_s^{(k)}$ represents the k-th received symbol energy, and $n_k$ is an additive white Gaussian noise process with zero mean and variance $\sigma_n^2 = N_0/2$. The hypotheses $H_0$ and $H_1$ are assumed to have the same a priori probability $Pr(H_0) = Pr(H_1) = \frac{1}{2}$.

Let $\Lambda(y_k)$ indicate the quantity:

$$\Lambda(y_k) = \ln \frac{Pr(H_1 \mid y_k)}{Pr(H_0 \mid y_k)}. \quad \text{Equation (2)}$$

A Bayes test based on the observation $y_k$ selects hypothesis $H_1$ if $\Lambda(y_k) > 0$, and $H_0$ if $\Lambda(y_k) < 0$. Modelling $H_0$ and $H_1$ in Equation (1) as the events $\{a_k = 0\}$ and $\{a_k = \pm 1/\sqrt{2}\}$, respectively, Equation (2) can be rewritten as:

$$\Lambda(y_k) = \ln \frac{Pr(a_k = \pm 1/\sqrt{2} \mid y_k)}{Pr(a_k = 0 \mid y_k)}. \quad \text{Equation (3)}$$

Then, assuming $Pr(H_0) = Pr(H_1) = \frac{1}{2}$, $Pr(a_k = +1/\sqrt{2} \mid H_1) = Pr(a_k = -1/\sqrt{2} \mid H_1) = \frac{1}{2}$ and applying Bayes' rule:

$$\Lambda(y_k) = \ln \frac{(1/2)p(y_k \mid a_k = +1/\sqrt{2}) + (1/2)p(y_k \mid a_k = -1/\sqrt{2})}{p(y_k \mid a_k = 0)} = \quad \text{Equation (4)}$$

$$\ln \frac{1}{2} + \ln \frac{\exp\left[-(y_k - \sqrt{E_s^{(k)}}/\sqrt{2})^2 / N_0\right] + \exp\left[-(y_k + \sqrt{E_s^{(k)}}/\sqrt{2})^2 / N_0\right]}{\exp[-y_k^2/N_0]} =$$

$$-\frac{1}{2} \frac{E_s^{(k)}}{N_0} + \text{lncosh}\left(\sqrt{2}\, y_k \frac{\sqrt{E_s^{(k)}}}{N_0}\right)$$

and the likelihood ratio test:

$$\text{lncosh}\left(\sqrt{2}\, y_k \frac{\sqrt{E_s^{(k)}}}{N_0}\right) \gtrless \frac{1}{2} \frac{E_s^{(k)}}{N_0}. \quad \text{Equation (5)}$$

To derive the Bayes test based on the observation set $y = \{y_0, y_1, \ldots, y_{N-1}\}$, in place of Equation (2) Equation (6) is defined:

$$\Lambda(y) = \ln \frac{Pr(H_1 \mid y_0, y_1, \ldots, y_{N-1})}{Pr(H_0 \mid y_0, y_1, \ldots, y_{N-1})}. \quad \text{Equation (6)}$$

In this case, Equation (4) becomes:

$$\Lambda(y) = \ln \frac{\prod_{k=0}^{N-1} \left[ (1/2) p(y_k \mid a_k = +1/\sqrt{2}) + (1/2) p(y_k \mid a_k = -1/\sqrt{2}) \right]}{\prod_{k=0}^{N-1} p(y_k \mid a_k = 0)} = \quad \text{Equation (7)}$$

$$-\frac{1}{2} \sum_{k=0}^{N-1} \frac{E_s^{(k)}}{N_0} + \sum_{k=0}^{N-1} \ln\cosh\left( \sqrt{2}\, y_k \frac{\sqrt{E_s^{(k)}}}{N_0} \right).$$

Therefore, the likelihood ratio test $\Lambda \gtrless 0$ can be implemented as:

$$\frac{1}{N} \sum_{k=0}^{N-1} \ln\cosh\left( \sqrt{2}\, y_k \frac{\sqrt{E_s^{(k)}}}{N_0} \right) \gtrless \frac{1}{2} \frac{E_s}{N_0} \quad \text{Equation (8)}$$

where $$E_s = (1/N) \sum_{k=0}^{N-1} E_s^{(k)},$$

or equivalently, letting $L(y_k) = \sqrt{2}\, y_k \sqrt{E_s^{(k)}}/N_0$ $$\frac{1}{N} \sum_{k=0}^{N-1} \ln\cosh[L(y_k)] \gtrless \frac{1}{2} \frac{E_s}{N_0}. \quad \text{Equation (9)}$$

Note that, in the case where each noise sample $n_k$ is modelled as a Gaussian random variable with zero mean and variance $\sigma_{2(k)}^2 = N_0^{(k)}/2$ (non-stationary noise process), the quantities $E_s/N_0$ and $L(y_k)$ of Equation (9) should be redefined as $$E_s/N_0 = (1/N) \sum_{k=0}^{N-1} \left( E_s^{(k)}/N_0^{(k)} \right)$$

and $L(y_k) = \sqrt{2}\, y_k \sqrt{E_s^{(k)}}/N_0^{(k)}$.

The process of Equation (9) is the optimum process illustrated in FIG. 2. To implement the optimum test (9), the receiver comprises a division function 30, which receives values of the received symbol energy $E_s^{(k)}$ and the estimated noise $N_0^{(k)}$ for each received sample from the power estimation block 10. The function 30 takes the ratio of these values for each sample and supplies them to estimation block 32 which provides an averaged ratio $E_s/N_0$ over N samples (observation interval). In this way, the estimation function 30 and average block 32 derive an estimate of the parameter $E_s/N_0$ over the observation interval N. (If the noise is stationary (i.e., if $N_0^{(k)} = N_0$), the received symbol energy $E_s^{(k)}$ is applied at the input of the average block 32. The output of block 32 and the estimated average noise $N_0$ are then input to the function 30, which finally provides the averaged ratio $E_s/N_0$.) The LLR calculation block 10 computes the log-likelihood ratios $L(y_k)$ from the samples $\{y_0, y_1, \ldots, y_{N-1}\}$ from the same observation interval. The LLR values $L(y_k)$ are passed through a nonlinearity $\ln\cosh(\cdot)$, function 38, which may be implemented by means of a look-up table. The detection metric on the left-hand side of Equation (9) can be then obtained by averaging in block 40 the output of the nonlinearity over the observation set.

The metric on the right hand side of Equation 9 can be determined by multiplying the summed ratio $E_s/N_0$ by the fixed value ½ using multiplier 34. The inequality can be then determined at block 36, which selects hypothesis $H_0$ or $H_1$.

For moderate to high signal-to-noise ratios, from Equation (7) is also written:

$$\Lambda(y) = \quad \text{Equation (10)}$$

$$\sum_{k=0}^{N-1} \left\{ \ln\frac{1}{2} - \frac{1}{2} \frac{E_s^{(k)}}{N_0} + \ln(\exp[L(y_k)] + \exp[-L(y_k)]) \right\} \approx$$

$$N\left( \ln\frac{1}{2} - \frac{1}{2} \frac{E_s}{N_0} \right) + \sum_{k=0}^{N-1} |L(y_k)|$$

and the optimum test Equation (9) is approximated as:

$$\frac{1}{N} \sum_{k=0}^{N-1} |L(y_k)| \gtrless \frac{1}{2} \frac{E_s}{N_0} - \ln\frac{1}{2}. \quad \text{Equation (11)}$$

More generally, the approximate test may be written as:

$$\frac{1}{N} \sum_{k=0}^{N-1} |L(y_k)| \gtrless \frac{1}{2} \frac{E_s}{N_0} + \eta \quad \text{Equation (12)}$$

where $\eta$ is a constant. FIG. 3 illustrates the approximate test of equation 12. Like numerals in FIG. 3 denote like parts as in FIG. 2. In place of the $\ln\cosh(\cdot)$ function 38, a modulus function 42 is applied to the LLRs $L(y_k)$. The summation block 40 sums the absolute values of the LLRs over the observation interval N and supplies the resulting values to selection block 36.

Instead of supplying the value $(½)E_s/N_0$ directly to the selection block 36, the value is summed at summer 44 with the value $\eta$. The quantity $|L(y_k)| + \ln(½)$ is a good approximation of $\ln\cosh[L(y_k)]$ for moderate to high values of $E_s/N_0$. At low $E_s/N_0$, however, $|L(y_k)| + \ln(½)$ is smaller than $\ln\cosh[L(y_k)]$. It is possible to see that, below a given value of $E_s/N_0$, the function $$(1/N) \sum_{k=0}^{N-1} |L(y_k)| + \ln(1/2)$$

is always smaller than $(½)E_s/N_0$ even in the presence of a transmitted signal. This behaviour reduces the range of signal-to-noise ratios over which it is possible to perform detection using the approximate test (Equation 11). In a 3GPP WCDMA system, this may degrade the receiver error performance at low signal-to-noise ratios, and it may affect the correct operation of the CPCH downlink fast power control.

WCDMA downlink power control is based on an outer loop power control algorithm, which uses information on the number of successfully and unsuccessfully decoded DCH data blocks, determined by the pass or fail of the Cyclic Redundancy Check (CRC) that relies on parity bits appended to each data block before encoding. In the outer loop power control algorithm, CRC pass/fail is employed to control a target signal-to-interference ratio (SIR), according to the DCH quality (block-error rate) target set by the network. This SIR target is then used by the inner loop power control algorithm, to derive a power control command to be transmitted in the uplink, which requests an increase or decrease of the downlink DPCH power. CRC failures drive the SIR target upwards, so that the user equipment requests an increase of the transmitted power, in an effort to improve the error performance towards the target block-error rate. For this algorithm to function correctly, the transmitted blocks must be detected, regardless of whether they can subsequently be successfully decoded or not (CRC pass/fail). For low values of $E_s/N_0$, the use of the approximate test Equation (11) leads to consistent failures to detect blocks, which prevents the possibility of identifying unsuccessful decoding (CRC fail). As a consequence, the outer loop power control would be unable to drive an increase of the DPCH downlink power transmitted to the UE. To avoid this pathological situation, a suitable constant $\eta$ in Equation (12) may be selected using select block 46 such that the detection range can be extended to low signal-to-noise ratios.

It is worth noting that the value of $\eta$ chosen on the basis of the required detection range may degrade the probability of false alarm at higher signal-to-noise ratios. To circumvent this problem, $\eta$ can be made a function of the measured $E_s/N_0$, for instance setting $\eta$ to different constant values for different intervals of $E_s/N_0$. In this case, $\eta=\eta(E_s/N_0)$ may be chosen equal to $-\ln(\frac{1}{2})$ for values of the measured $E_s/N_0$ greater than a suitable threshold.

In a WCDMA receiver, the quantity $E_s/N_0$ can be obtained from estimates of $E_s^{(k)}$ and $N_0^{(k)}$ derived from the DPCCH dedicated pilot symbols transmitted on each downlink DPCH slot. As shown in FIG. 1, the set of LLRs $L(y_k)$ can be computed from the set of DPDCH signal samples $\{y_0, y_1, \ldots, y_{N-1}\}$, and the estimates of $E_s^{(k)}$ and $N_0^{(k)}$ for the slots in which each DPDCH symbol is received. The transport format detection algorithm then uses the set of $L(y_k)$ to derive the detection metric $$(1/N)\sum_{k=0}^{N-1}|L(y_k)|$$

of equation (12). Once $E_s^{(k)}$, $N_0^{(k)}$ and $L(y_k)$ have been calculated, the actual received DPCH samples are no longer needed for the algorithm.

Figure 4:
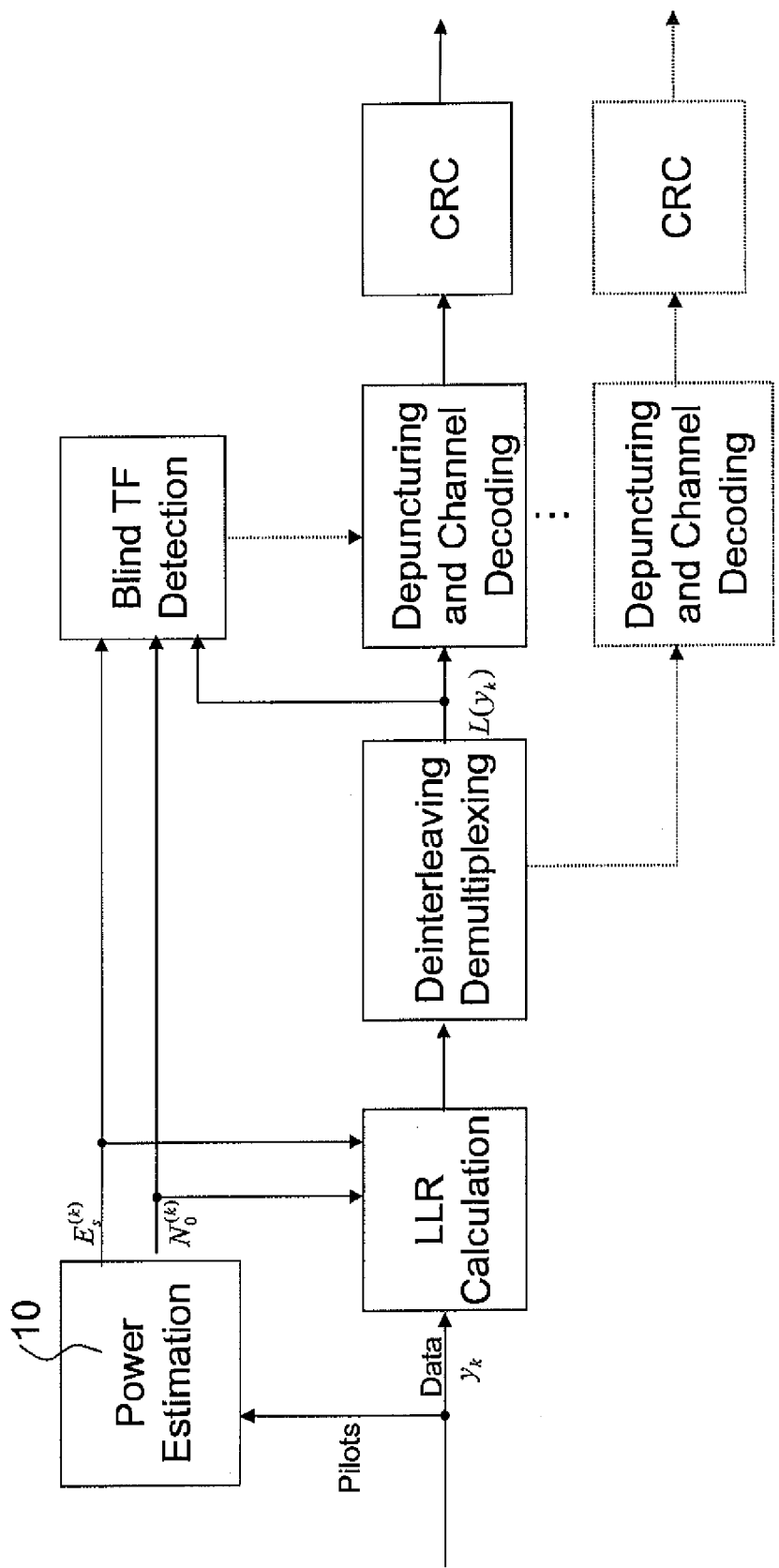
FIG. 4 is a schematic block diagram of an alternative embodiment of the invention.

For a WCDMA receiver, in the case where different code blocks are multiplexed and transmitted on the same DPCH physical channel, with the approach shown in FIG. 1 the LLRs $L(y_k)$ to be used for transport format detection are collected per slot, before deinterleaving and code block demultiplexing. This requires the identification of the values $y_k$ of the DPCH slot that correspond to the different code blocks. In this respect, it may be advantageous to collect the LLRs for transport format detection after deinterleaving and code block demultiplexing, as shown in FIG. 4. The reason for this is that the LLRs represent the signal quality which is affected by transmission conditions. It is very likely to be the case therefore that a particular subset of adjacent samples (multiplexed from different channels) will nevertheless have similar LLRs which would be unrepresentative of later samples. By deinterleaving the channels before taking the LLR values, this ensures that the LLRs are randomly distributed so that an average of the first number of samples (for example 32) can be considered as representative of that block.

An additional advantage of the implementation of FIG. 4 is that it allows a simple way to reduce complexity by estimating the detection metric of Equation (12) over a subset N' of the N LLR values of a given code block. In fact, since the LLRs are collected after deinterleaving, one can compute $$(1/N')\sum_{k=0}^{N'-1}|L(y_k)|,$$

where N'<<N can be chosen in order not to appreciably affect the required detection performance.

The performance of the approximated test Equation (12) can be quantified in terms of probability of detection $P_D$ and probability of false alarm $P_F$. Using the approximate detection measure $$\gamma=(1/N)\sum_{k=0}^{N-1}|L(y_k)|$$

and the detection threshold $\theta=(\frac{1}{2})E_s/N_0+\eta$, are the following:

$$P_D=\int_\theta^\infty p(\gamma\mid H_1)d\gamma \qquad \text{Equation (13)}$$

$$P_F=\int_\theta^\infty p(\gamma\mid H_0)d\gamma \qquad \text{Equation (14)}$$

Since the number of observations N is usually relatively large, the function $\gamma$ can be modelled as a Gaussian random variable. Under this assumption, letting $d_1=E\{\gamma|H_1\}$ and $\sigma_1^2=E\{(\gamma-E\{\gamma|H_1\})^2|H_1\}$, provides:

$$P_D=\frac{1}{\sqrt{2\pi}\sigma_1}\int_\theta^\infty \exp\left[\frac{(\gamma-d_1)^2}{2\sigma_1^2}\right]d\gamma=\frac{1}{2}\text{erfc}\left(\frac{\theta-d_1}{\sqrt{2}\sigma_1}\right) \qquad \text{Equation (15)}$$

and letting $d_0=E\{\gamma|H_0\}$ and $\sigma_0^2=E\{(\gamma-E\{\gamma|H_0\})^2|H_0\}$ $$P_F=\frac{1}{\sqrt{2\pi}\sigma_0}\int_\theta^\infty \exp\left[\frac{(\gamma-d_0)^2}{2\sigma_0^2}\right]d\gamma=\frac{1}{2}\text{erfc}\left(\frac{\theta-d_0}{\sqrt{2}\sigma_0}\right). \qquad \text{Equation (16)}$$

Figure 5:
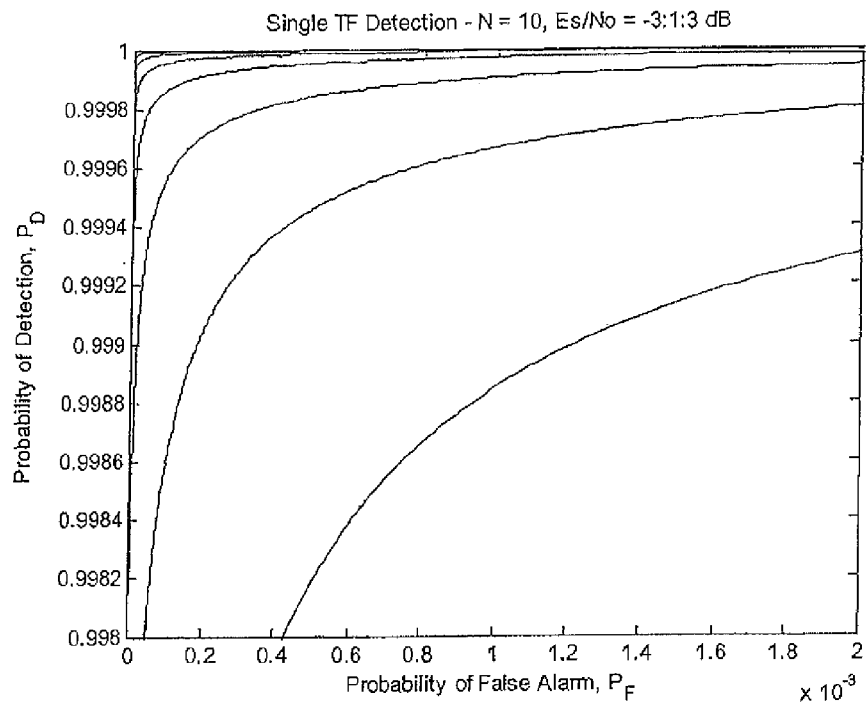
FIGS. 5 to 9 are graphs indicating the performance of the detection techniques discussed herein.
Figure 6:
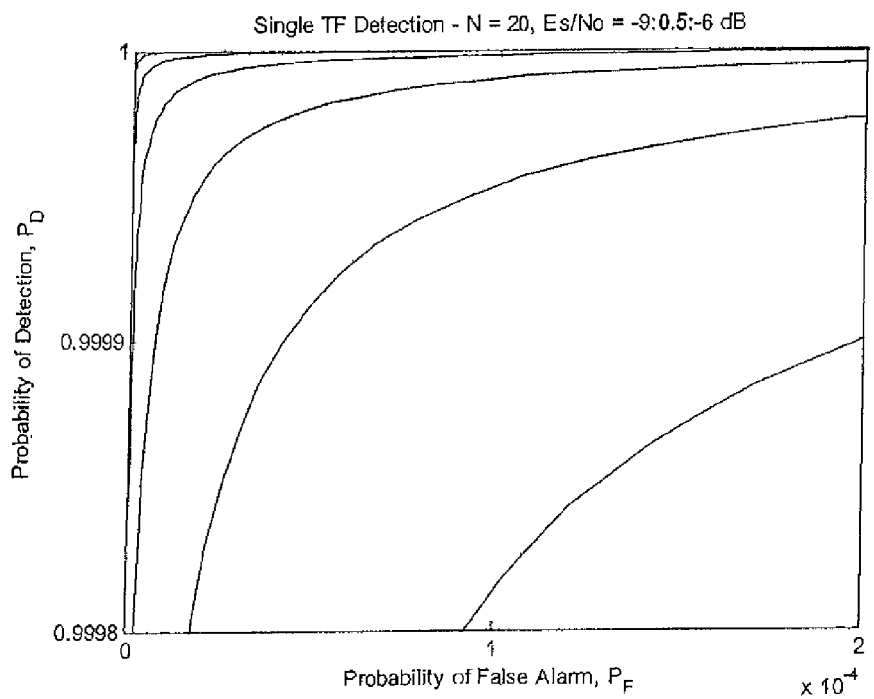

An example of the performance of the approximate test Equation (12) calculated using Equations (15) and (16) is shown in FIG. 5 and FIG. 6. The figures give the probability of detection $P_D$ and probability of false alarm $P_F$ as a function of the constant $\eta$ of Equation (12), for different values of $E_s/N_0$. The curves of FIG. 5 have been obtained computing Equation (15) and Equation (16) with N=10 and $E_s/N_0$ values from −3 dB and 3 dB, while FIG. 6 assumes N=20 and $E_s/N_0$ from −9 dB to −6 dB. From the results of FIG. 5, the modified algorithm Equation (12) gives values of 1−$P_D$ and $P_F$ below $2 \cdot 10^{-4}$ for $E_s/N_0 \geq 0$ dB, using only N=10 observation samples. As shown in FIG. 6, increasing the number of observations to N=20 one obtains probabilities $1-P_D$ and $P_F$ below $2 \cdot 10^{-4}$ for $E_s/N_0 \geq -9$ dB.

Figure 7:
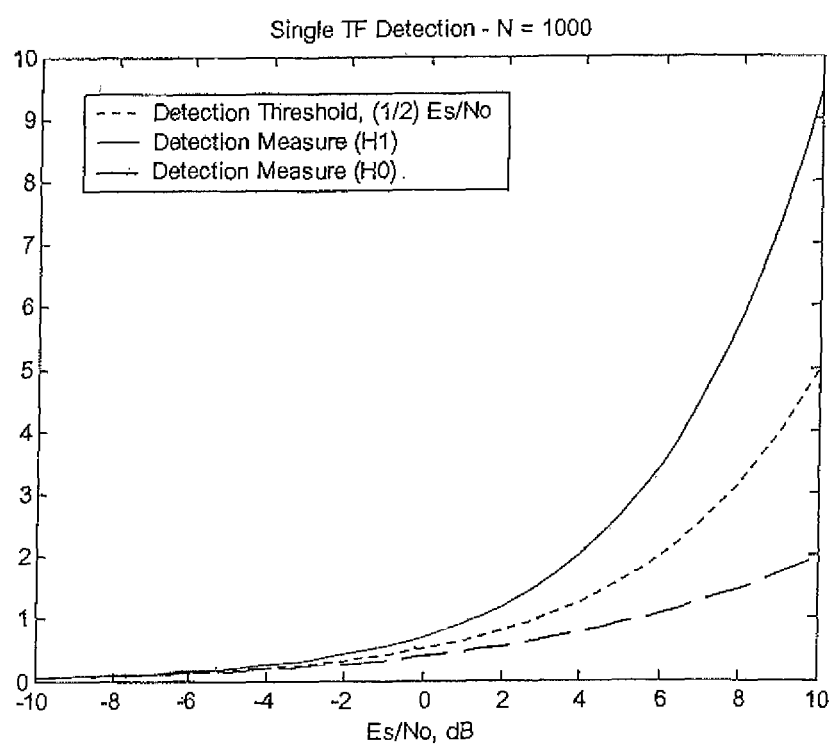
Figure 8:
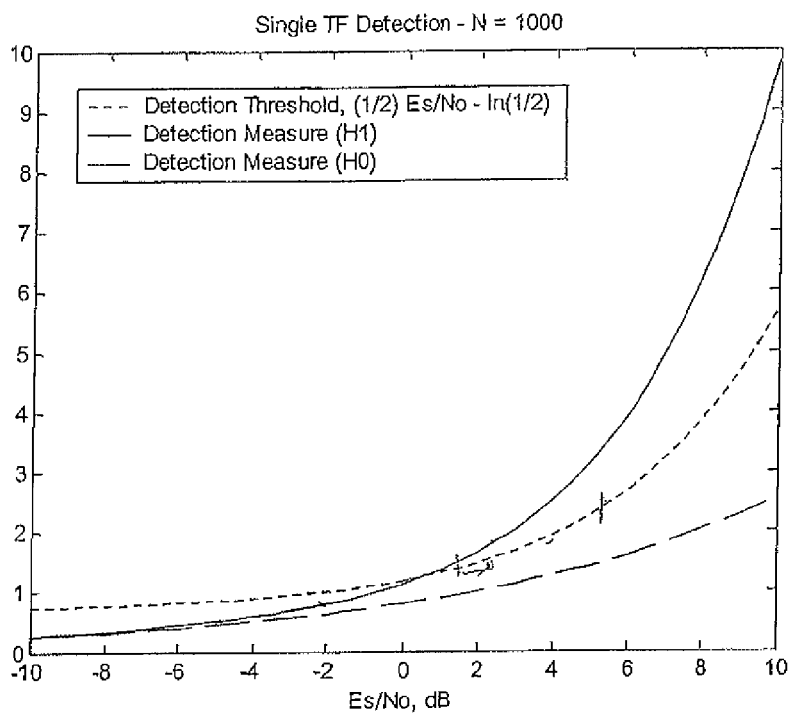
Figure 9:
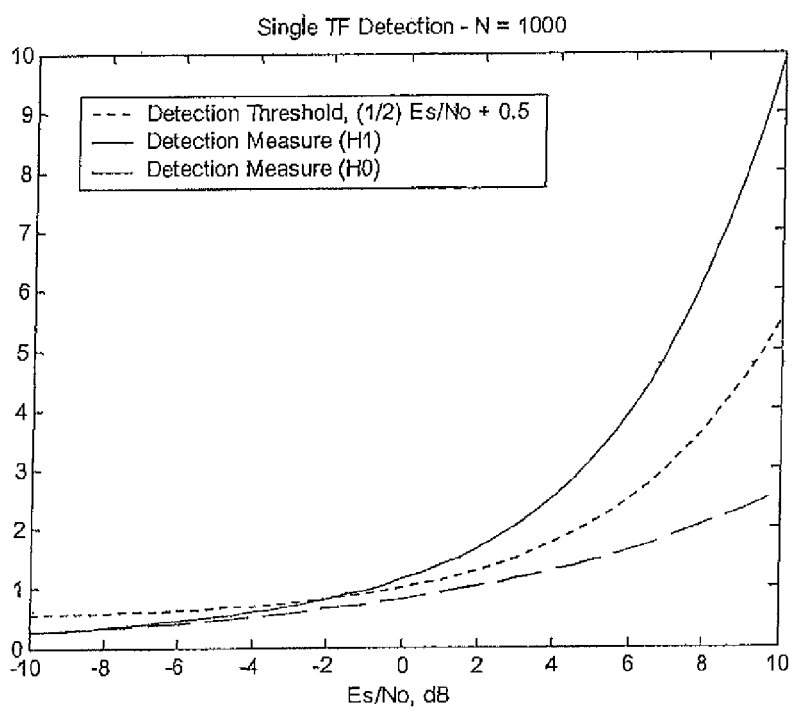

The behaviour of the optimum and approximate detection algorithms Equation (9) and Equation (12) is compared in FIGS. 7-9. The curves have been obtained by generating the signal samples $y_k$ under the hypotheses $H_0$ and $H_1$, with a noise power $N_0/2=\frac{1}{2}$ and for different values of average symbol energy $E_s$. The detection metrics of Equation (9), Equation (11) and Equation (12) have been computed for each sample $y_k$, and the results have been averaged over N=1000 observations.

In FIG. 7, the optimum detection measure under hypotheses $H_0$ and $H_1$ is compared with the threshold $(\frac{1}{2})E_s/N_0$, where in FIG. 8 and FIG. 9, the measure $$(1/N)\sum_{k=0}^{N-1}|L(y_k)|$$

is compared with the thresholds $(\frac{1}{2})E_s/N_0 - \ln(\frac{1}{2})$ and $(\frac{1}{2})E_s/N_0 + 0.5$, respectively. As shown in FIG. 8, the modified test of Equation (11) without selectable constant η does not allow signal detection for $E_s/N_0 < 0$ dB, where from FIG. 9 using the constant η=0.5 in Equation (12) disables signal detection only for $E_s/N_0 < -2$ dB, thus giving a wider range of signal-to-noise ratios over which the outer loop power control can correctly operate.

Those skilled in the art to which this application relates will appreciate that other and further additions, deletions, substitutions and modifications may be made to the described embodiments. The scope of the invention is not limited by the described embodiments, but only by the following claims.

What is claimed is:

1. A method of processing transmissions in a wireless communication system in a blind transport format detection process to detect whether a transport block is a zero transport block that has a data rate equal to zero or non-zero transport block that has full rate data, the method comprising:
   receiving a plurality of samples of the transport block;
   estimating a signal power and a disturbance power for the plurality of samples;
   determining for each sample at least one bit reliability indicator which is related to a probability that a bit decoded from the sample is a one or a zero; and
   using the signal power and the disturbance power estimates as well as the at least one determined bit reliability indicator for blind transport format detection, the steps of blind transport format detection comprising:
      dividing the estimated signal power and the disturbance power to determine a signal-to-disturbance ratio for the plurality of samples of the transport block;
      averaging the signal-to-disturbance ratios over the plurality of samples of the transport block to generate an average signal-to-disturbance ratio;
      applying a natural logarithm of the hyperbolic cosine (ln cosh(·)) to the determined bit reliability indicators from the plurality of samples;
      averaging of the natural logarithm of the hyperbolic cosine function of the bit reliability indicators to generate an average of the natural logarithm of the hyperbolic cosine function of the bit reliability indicators; and
      using the average of the natural logarithm of the hyperbolic cosine function of the bit reliability indicators and a factor proportional to the average signal-to-disturbance ratio to determine whether the transport block is a zero transport block that has a data rate equal to zero or non-zero transport block that has full rate data.

2. The method according to claim 1, wherein the natural logarithm of the hyperbolic cosine function is implemented using the following:

$$\frac{1}{N}\sum_{k=0}^{N-1} \ln\cosh[L(y_k)] \gtreqless \frac{1}{2}\frac{E_s}{N_0}$$

where N is the number of samples, $L(y_k)$ is a bit reliability indicator for the kth sample, and $E_s/N_o$ is the average signal to noise ratio.

3. The method according to claim 1, in which a plurality of channels are multiplexed in said transmission, and wherein the step of generating the average of the natural logarithm of the hyperbolic cosine function of the bit reliability indicators is effected for the multiplexed transmission.

4. The method according to claim 1, wherein a plurality of channels are multiplexed in each transmission, the method comprising a step of demultiplexing said channels prior to the step of generating the average of the natural logarithm of the hyperbolic cosine function of the bit reliability indicators, wherein said average of the natural logarithm of the hyperbolic cosine function of the bit reliability indicators is generated for each channel.

5. A method of processing transmissions in a wireless communication system in a blind transport format detection process to detect whether a transport block is a zero transport block that has a data rate equal to zero or is a non-zero transport block that has full rate data, the method comprising:
   receiving a plurality of samples of the transport block;
   estimating a signal power and a disturbance power for the plurality of samples;
   determining for each sample at least one bit reliability indicator which represents a probability that a bit decoded from the sample is a one or a zero; and
   using the signal power and the disturbance power estimates as well as the at least one determined bit reliability indicator for blind transport format detection, the steps of blind transport format detection comprising:
      dividing the estimated signal power and the disturbance power to determine a signal-to-disturbance ratio for the plurality of samples of the transport block;
      averaging the signal-to-disturbance ratios over the plurality of samples of the transport block to generate an average signal-to-disturbance ratio;
      comparing an average of the absolute values of the determined bit reliability indicators from the plurality of samples with a value which is a sum of a factor proportional to the average signal-to-disturbance ratio and a selectable constant to determine whether the transport block is a zero transport block that has a data rate equal to zero or is a non-zero transport block that has full rate data.

6. The method according to claim 5, wherein the comparison is as follows:

$$\frac{1}{N}\sum_{k=0}^{N-1}|L(y_k)| \gtreqless \frac{1}{2}\frac{E_s}{N_0}+\eta$$

where N is the number of samples, $L(y_k)$ is a bit reliability indicator for the kth sample, $E_s/N_o$ is the average signal-to-disturbance ratio and η is the selectable constant.

7. The method according to claim 5, where the selectable constant (η) is selected based on the average signal-to-disturbance ratio.

8. The method according to claim 6, where the selectable constant (η) is selected based on the average signal-to-disturbance ratio.

9. A system for processing transmissions in a digital communications system in a blind transport format detection process to detect whether a transport block is a zero transport block that has a data rate equal to zero or is a non-zero transport block that has full rate data, the system comprising:
   a receiver front end and signal detector for receiving a plurality of samples of the transport block;
   a power estimator that receives the plurality of samples and estimates a signal power and a disturbance power for the plurality of samples;
   a log-likelihood ratio calculator that receives the plurality of samples and produces at least one bit reliability indicator for each sample which is related to a probability that a bit decoded from the plurality of samples is a one or a zero; and
   a blind transport format detector that receives the signal power and the disturbance power estimates from the power estimator as well as the at least one bit reliability indicator for each sample; wherein the blind transport format detector comprises:
      a divider that receives the signal power and the disturbance power estimates for determining a signal-to-disturbance ratio for the plurality of samples of the transport block;
      an estimator that averages the signal-to-disturbance ratios over the plurality of samples of the transport block to generate an average signal-to-disturbance ratio;
      a means for applying a natural logarithm of the hyperbolic cosine function (In cosh(·)) to the bit reliability indicators from the plurality of received samples;
      a summator for generating an average function of the natural logarithm of the hyperbolic cosine function of the bit reliability indicators; and
      a selector for using the average of the natural logarithm of the hyperbolic cosine function of the bit reliability indicators and a factor proportional to the average signal-to-disturbance ratio to determine whether the transport block is a zero transport block that has a data rate equal to zero or is a non-zero transport block that has full rate data.

10. The system according to claim 9, wherein the receiver front end and signal detector is arranged to receive an analog wireless signal and to convert said analogue wireless signal into said plurality of samples.

11. The system according to claim 10, wherein said receiver front end and signal detector is configured to demultiplex and deinterleave a plurality of channels from a transmission in which a plurality of channels are multiplexed, said plurality of samples being derived from each said channel prior to the summator.

12. The system according to claim 10, wherein said estimator operates on a transmission in which a plurality of channels are multiplexed.

13. The system according to claim 9, which is a wide band code division multiple access system.

14. The system according to claim 9, wherein said power estimator generates a signal estimate and a disturbance estimate from pilot symbols.

15. A system for processing transmissions in a digital communications system in a blind transport format detection process to detect whether a transport block is a zero transport block that has a data rate equal to zero or is a non-zero transport block that has full rate data, the system comprising:
   a receiver front end and signal detector for receiving a plurality of samples of the transport block;
   a power estimator that receives the plurality of samples and estimates a signal power and a disturbance power for the plurality of samples;
   a log-likelihood ratio calculator that receives the plurality of samples and produces at least one bit reliability indicator for each sample which is related to a probability that a bit decoded from the plurality of samples is a one or a zero; and
   a blind transport format detector that receives the signal power and the disturbance power estimates from the power estimator as well as the at least one bit reliability indicator for each sample; wherein the blind transport format detector comprises:
      a divider that receives the signal power and the disturbance power estimates for determining a signal-to-disturbance ratio for the plurality of samples of the transport block;
      an estimator that averages the signal-to-disturbance ratios over the plurality of samples of the transport block to generate an average signal-to-disturbance ratio;
      a means for determining an absolute value of each of the bit reliability indicators from the plurality of received samples;
      a summator for generating an average function of the absolute values of the bit reliability indicators; and
      a selector for using the average of the absolute values of the reliability indicators and a value which is a sum of a factor proportional to the average signal-to-disturbance ratio and a selectable constant to determine whether the transport block is a zero transport block that has a data rate equal to zero or is a non-zero transport block that has full rate data.

16. The system according to claim 15, wherein the receiver front end and signal detector is arranged to receive an analog wireless signal and to convert said analog wireless signal into said plurality of samples.

17. The system according to claim 16, wherein said receiver front end and signal detector is configured to demultiplex and deinterleave a plurality of channels from a transmission in which a plurality of channels are multiplexed, said plurality of samples being derived from each said channel prior to the step of summator.

18. The system according to claim 16, wherein said estimator operates on a transmission in which a plurality of channels are multiplexed.

19. The system according to claim 15, which is a wide band code division multiple access system.

20. The system according to claim 15, wherein the power estimator generates a signal estimate and a disturbance estimate from pilot symbols.

21. The system according to claim 15, wherein the selectable constant is based on the average signal-to-disturbance ratio.

22. A receiver for processing transmissions in a wireless communications system in a blind transport format detection process to detect whether a transport block is a zero transport block that has a data rate equal to zero or is a non-zero transport block that has full rate data, the receiver comprising:
   a receiver front end and signal detector for receiving a plurality of samples of the transport block;
   a power estimator that receives the plurality of samples and estimates a signal power and a disturbance power for the plurality of samples;
   a log-likelihood ratio calculator that receives the plurality of samples and produces at least one bit reliability indicator for each sample which is related to a probability that a bit decoded from the plurality of samples is a one or a zero; and
   a blind transport format detector that receives the signal power and the disturbance power estimates from the power estimator as well as the at least one bit reliability indicator for each sample; wherein the blind transport format detector comprises:
      a divider that receives the signal power and the disturbance power estimates for determining a signal-to-disturbance ratio for the plurality of samples of the transport block;
      an estimator that averages the signal-to-disturbance ratios over the plurality of samples of the transport block to generate an average signal-to-disturbance ratio;
      a means for applying a natural logarithm of the hyperbolic cosine function (In cosh(·)) to the bit reliability indicators from the plurality of received samples;
      a summator for generating an average function of the natural logarithm of the hyperbolic cosine function of the bit reliability indicators; and
      a selector for using the average of the natural logarithm of the hyperbolic cosine function of the reliability indicators and a factor proportional to the average signal-to-disturbance ratio to determine whether the transport block is a zero transport block that has a data rate equal to zero or is a non-zero transport block that has full rate data.

23. A mobile terminal comprising the receiver according to claim 22.

24. A receiver for processing transmissions in a wireless communications system in a blind transport format detection process to detect whether a transport block is a zero transport block that has a data rate equal to zero or is a non-zero transport block that has full rate data, the receiver comprising:
   a receiver front end and signal detector for receiving a plurality of samples of the transport block;
   a power estimator that receives the plurality of samples and estimates a signal power and a disturbance power for the plurality of samples;
   a log-likelihood ratio calculator that receives the plurality of samples and produces at least one bit reliability indicator for each sample which is related to a probability that a bit decoded from the plurality of samples is a one or a zero; and
   a blind transport format detector that receives the signal power and the disturbance power estimates from the power estimator as well as the at least one bit reliability indicator for each sample; wherein the blind transport format detector comprises:
      a divider that receives the signal power and the disturbance power estimates for determining a signal-to-disturbance ratio for the plurality of samples of the transport block;
      an estimator that averages the signal-to-disturbance ratios over the plurality of samples of the transport block to generate an average signal-to-disturbance ratio;
      a means for determining an absolute value of each of the bit reliability indicators from the plurality of received samples;
      a summator for generating an average function of the absolute values of the bit reliability indicators; and
      a selector for using the average of the absolute values of the reliability indicators and a value which is a sum of a factor proportional to the average signal-to-disturbance ratio and a selectable constant to determine whether the transport block is a zero transport block that has a data rate equal to zero or is a non-zero transport block that has full rate data.

25. A mobile terminal comprising the receiver according to claim 24.

26. A non-transitory computer readable media comprising a computer program having a sequence of instructions which when executed by a computer implement a method of processing transmissions in a wireless communications system in a blind transport format detection process to detect whether a transport block is a zero transport block that has a data rate equal to zero or is a non-zero transport block that has full rate data, the method comprising the steps of:
   receiving a plurality of samples of the transport block;
   estimating a signal power and a disturbance power for the plurality of samples;
   determining for each sample at least one bit reliability indicator which is related to a probability that a bit decoded from the sample is a one or a zero; and
   using the signal power and the disturbance power estimates as well as the at least one determined bit reliability indicator for blind format detection, the steps of blind transport format detection comprising:
      dividing the estimated signal power and the disturbance power to determine a signal-to-disturbance ratio for the plurality of samples of the transport block;
      averaging the signal-to-disturbance ratios over the plurality of samples of the transport block to generate an average signal-to-disturbance ratio;
      applying a natural logarithm of the hyperbolic cosine (In cosh(·)) to the determined bit reliability indicators from the plurality of samples;
      averaging the natural logarithm of the hyperbolic cosine function of the reliability indicators to generate an average of the natural logarithm of the hyperbolic cosine function of the reliability indicators; and
      using the average of the natural logarithm of the hyperbolic cosine function of the bit reliability indicators and a factor proportional to the average signal-to-disturbance ratio to determine whether the transport block is a zero transport block that has a data rate equal to zero or is a non-zero transport block that has full rate data.

27. A non-transitory computer readable media comprising a computer program having a sequence of instructions which when executed by a computer implement a method of processing transmissions in a wireless communications system in a blind transport format detection process to detect whether a transport block is a zero transport block that has a data rate equal to zero or is a non-zero transport block that has full rate data, the method comprising the steps of:

receiving a plurality of samples of the transport block;

estimating a signal power and a disturbance power for the plurality of samples;

determining for each sample at least one bit reliability indicator which is related to a probability that a bit decoded from the sample is a one or a zero; and using the signal power and the disturbance power estimates as well as the at least one determined bit reliability indicator for blind transport format detection, the steps of blind transport format detection comprising:

dividing the estimated signal power and the disturbance power to determine a signal-to-disturbance ratio for the plurality of samples of the transport block;

averaging the signal-to-disturbance ratios over the plurality of samples of the transport block to generate an average signal-to-disturbance ratio; and comparing an average of the absolute values of the determined bit reliability indicators from the plurality of samples with a value which is a sum of a factor proportional to the average signal-to-disturbance ratio and a selectable constant to determine whether the transport block is a zero transport block that has a data rate equal to zero or is a non-zero transport block that has full rate data.

* * * * *